United States Patent
Togawa (10) Patent No.: US 9,437,455 B2
(45) Date of Patent: Sep. 6, 2016

(54) MANUFACTURING METHOD FOR SEMICONDUCTOR DEVICE

(71) Applicant: Norihiro Togawa, Nagoya (JP)

(72) Inventor: Norihiro Togawa, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/151,378

(22) Filed: Jan. 9, 2014

(65) Prior Publication Data

US 2014/0199826 A1    Jul. 17, 2014

(30) Foreign Application Priority Data

Jan. 11, 2013   (JP) .................................. 2013-003361

(51) Int. Cl.
- *H01L 21/00* (2006.01)
- *H01L 21/324* (2006.01)
- *H01L 21/04* (2006.01)
- *H01L 29/16* (2006.01)

(52) U.S. Cl.
CPC ........... *H01L 21/324* (2013.01); *H01L 21/046* (2013.01); *H01L 29/1608* (2013.01)

(58) Field of Classification Search
CPC ........... H01L 29/1606; H01L 29/1602; H01L 29/1608

USPC ........................ 438/105, 542, 522, 530, 623; 257/E21.041, E21.242

See application file for complete search history.

(56) References Cited

U.S. PATENT DOCUMENTS

| | | | |
|---|---|---|---|
| 2008/0224940 A1* | 9/2008 | Sugiyama | ............ H01L 23/145 343/873 |
| 2008/0311706 A1* | 12/2008 | Dozen et al. | ................. 438/127 |

FOREIGN PATENT DOCUMENTS

| JP | 2001-068428 A | 3/2001 |
|---|---|---|
| JP | 2004-315297 A | 11/2004 |
| JP | 2005-303010 A | 10/2005 |
| JP | 2011-096905 A | 5/2011 |
| JP | 2011-121787 A | 6/2011 |
| JP | 2011-233780 A | 11/2011 |

* cited by examiner

*Primary Examiner* — Julia Slutsker
(74) *Attorney, Agent, or Firm* — Dinsmore & Shohl LLP (57) ABSTRACT

A manufacturing method for a semiconductor device includes introducing an impurity into a SiC substrate, forming a mixed material layer, which is made from a resin and a fibrous carbon material, on a surface of the SiC material into which the impurity is introduced, performing heat treatment of the SiC substrate in which the mixed material layer is formed on the surface of the SiC substrate, and removing the mixed material layer after the heat treatment.

6 Claims, 8 Drawing Sheets

MANUFACTURING METHOD FOR SEMICONDUCTOR DEVICE

INCORPORATION BY REFERENCE

The disclosure of Japanese Patent Application No. 2013-003361 filed on Jan. 11, 2013 including the specification, drawings and abstract is incorporated herein by reference in its entirety.

BACKGROUND OF THE INVENTION

1. Field of the Invention

The invention relates to a manufacturing method for a semiconductor device.

2. Description of Related Art

In a manufacturing method for a semiconductor device using a SiC substrate, heat treatment is carried out in order to, for example, activate an impurity introduced into the SiC substrate. During the heat treatment, sublimation of Si (silicon) on a surface of the SiC substrate happens, which can cause deterioration of flatness of the surface of the SiC substrate. In a manufacturing method for a semiconductor device described in Japanese Patent Application Publication No. 2001-068428 (JP 2001-068428 A), a photoresist layer is formed on a surface of a SiC substrate before carrying out heat treatment of the SiC substrate. Once the SiC substrate is heat-treated, the photoresist layer is carbonized, and a graphite layer is formed. The graphite layer works as a protective coat during heat treatment. Therefore, sublimation of Si on the surface of the SiC substrate is restrained.

However, the photoresist layer contains components other than carbon, such as oxygen and sulfur. While oxygen, sulfur and so on are lost from the photoresist layer, carbon remains, thereby forming the graphite layer. Thus, density of carbon present inside the graphite layer is relatively low. As a result, heat resistance of the graphite layer may not be sufficient.

SUMMARY OF THE INVENTION

The present invention provides a manufacturing method for a semiconductor device, by which heat resistance of a protective coat during heat treatment of a SiC substrate is improved.

A first aspect of the present invention relates to a manufacturing method for a semiconductor device. The manufacturing method for the semiconductor device includes introducing an impurity into a SiC substrate. The manufacturing method includes forming a mixed material layer, which is made of a resin and a fibrous carbon material, on a surface of the SiC substrate into which the impurity is introduced. The manufacturing method includes performing heat treatment of the SiC substrate in which the mixed material layer is formed on the surface of the SiC substrate. The manufacturing method includes removing the mixed material layer after the heat treatment.

In the first aspect of the present invention, the fibrous carbon material protects the surface of the SiC substrate during the heat treatment of the SiC substrate. Therefore, it is possible to improve heat resistance of a protective coat.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Some elements of the examples described in this specification will be stated below. Each of the items stated below has separate technical utility.

In a manufacturing method for a semiconductor device described in this specification, forming a mixed material layer may include forming a resin layer on a surface of a SiC substrate. Forming the mixed material layer may include introduction of a fibrous carbon material into the formed resin layer.

In the above-mentioned manufacturing method of the semiconductor device, the resin layer is formed on the surface of the SiC substrate, and thereafter, the mixed material layer is formed by introducing the fibrous carbon material into the resin layer. Thus, it is possible to form the mixed material layer, which is made from a resin and the fibrous carbon material, on the surface of the SiC substrate.

In a manufacturing method for a semiconductor device described in this specification, the mixed material layer may be formed by applying a mixed material, which is made by mixing the resin and the fibrous carbon material, onto the surface of the SiC substrate.

In the above-mentioned manufacturing method for the semiconductor device, the mixed material layer is formed on the surface of the SiC substrate by the mixed material that is made by mixing the resin and the fibrous carbon material. Thus, it is also possible to form the mixed material layer, which is made from the resin and the fibrous carbon material, on the surface of the SiC substrate.

First Example

Figure 3:
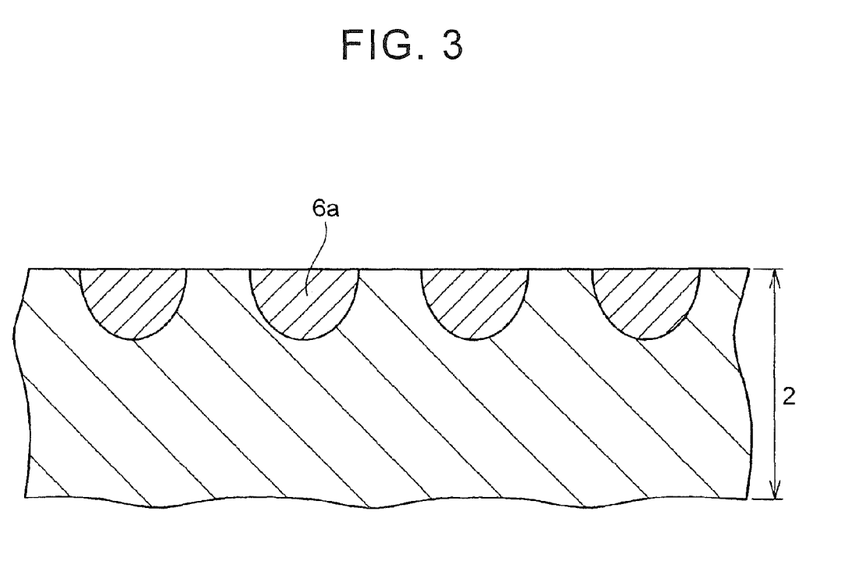
FIG. 3 is a sectional view showing a state where impurity regions are formed in a SiC substrate by the manufacturing method for the semiconductor device according to the first example of the present invention.

A manufacturing method according to this example is a manufacturing method for a semiconductor device such as MOSFET. However, the semiconductor device may be IGBT, a diode, and so on. In the manufacturing method according to this example, impurity regions 6a are formed in a surface of a SiC substrate 2 in order to form an element structure of MOSFET and the like in the SiC substrate (FIG. 3). A publicly known structure is used for the structure of the semiconductor device such as MOSFET, and explanation of the structure is thus omitted.

Figure 4:
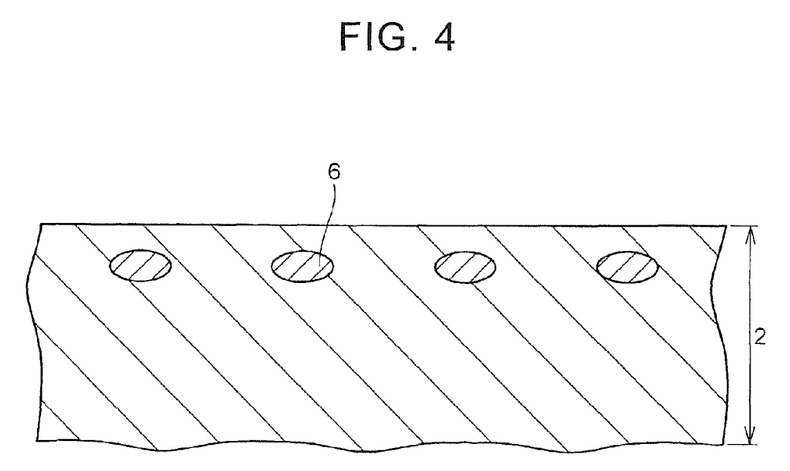
FIG. 4 is a sectional view showing a step for manufacturing the semiconductor device according to the first example of the present invention.

The manufacturing method according to this example will be explained below using FIG. 1 to FIG. 7. First of all, in step S2, an impurity (impurity ion) 6 is introduced into the SiC substrate 2 (FIG. 4). It is possible to introduce the impurity into the SiC substrate 2 by ion implantation. Since it is possible to carry out the impurity introduction step in S2 similarly to a publicly known method, detailed explanation of S2 is omitted.

Figure 2:
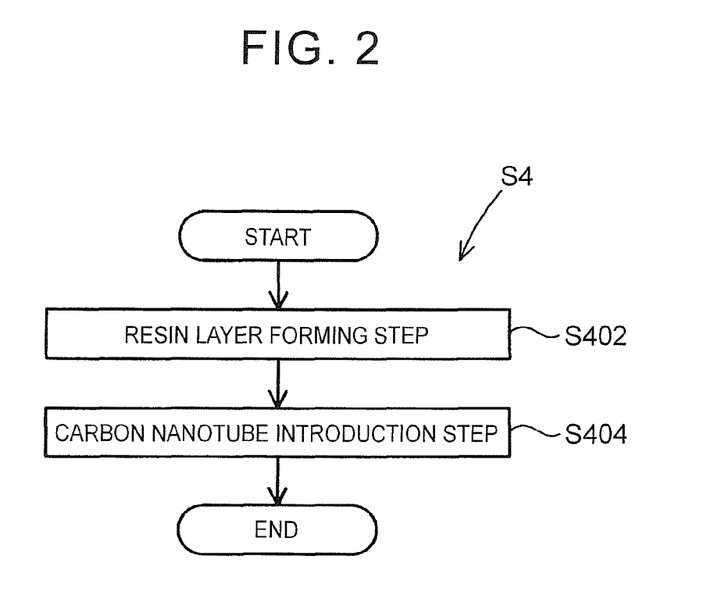
FIG. 2 is a flow diagram showing the manufacturing method for the semiconductor device according to the first example of the present invention.

Step S4 is a step for forming a mixed material layer 18 on the surface of the SiC substrate 2. As shown in FIG. 2, step S4 in this example includes step S402 and step S404.

Figure 5:
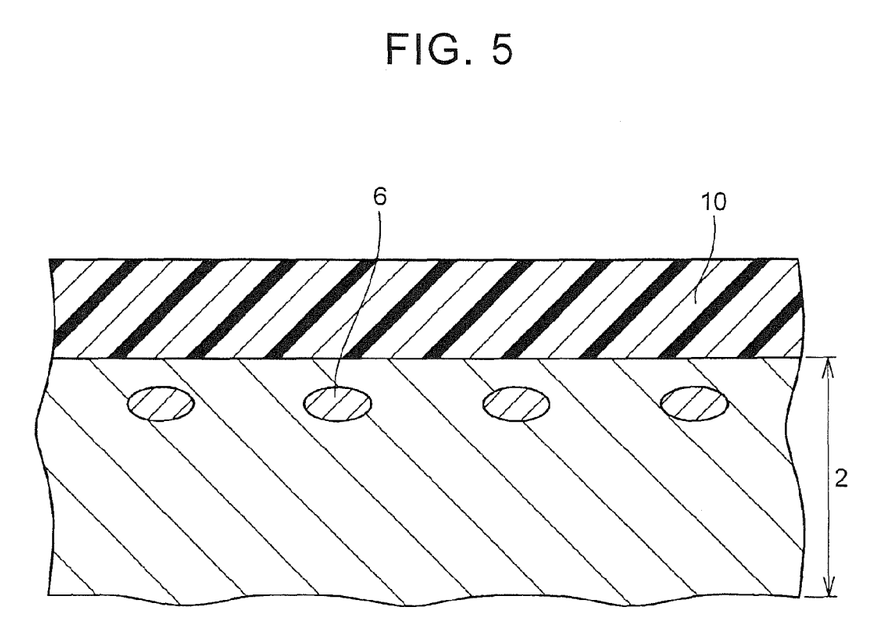
FIG. 5 is a sectional view showing a step for manufacturing the semiconductor device according to the first example of the present invention.

Step S402 is a step for applying a liquid resin 10 on the surface of the SiC substrate 2 (FIG. 5). For the resin 10, a phenolic resin, for example, may be used. A resin used as a resist mask may also be used as the resin 10. A spin coat method, for example, may be used as a method for applying the resin 10. A temperature for applying the resin 10 may be, for example, an ambient temperature.

Figure 6:
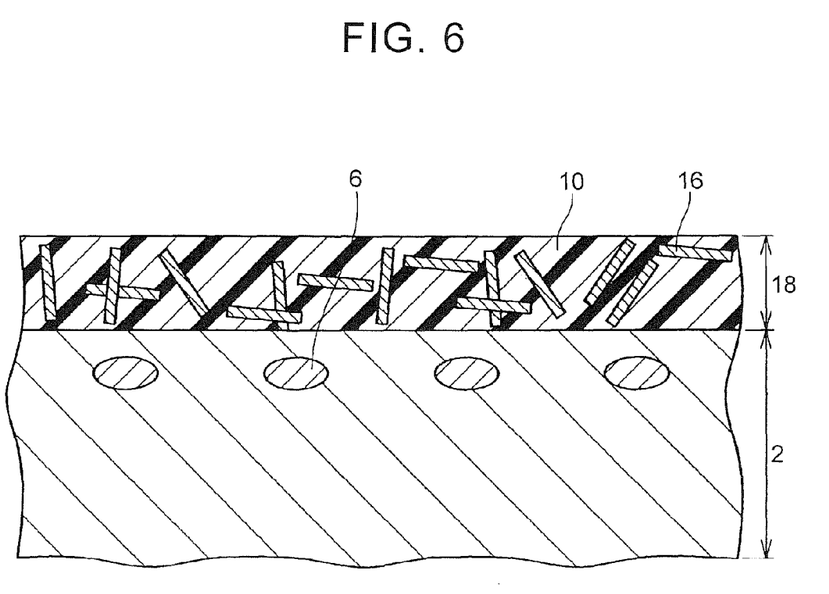
FIG. 6 is a sectional view showing a step for manufacturing the semiconductor device according to the first example of the present invention.

Step S404 is a step for introducing carbon nanotubes 16 inside the resin 10. Specifically, the carbon nanotubes 16 are sprinkled into the liquid-state resin 10 (FIG. 6).

Therefore, the carbon nanotubes 16 are mixed into the resin 10. As the carbon nanotubes 16 are mixed into the resin 10, a mixed material layer 18 is formed. In the following explanation, the mixed material layer 18 will be sometimes referred to as a protective coat 18.

Figure 7:
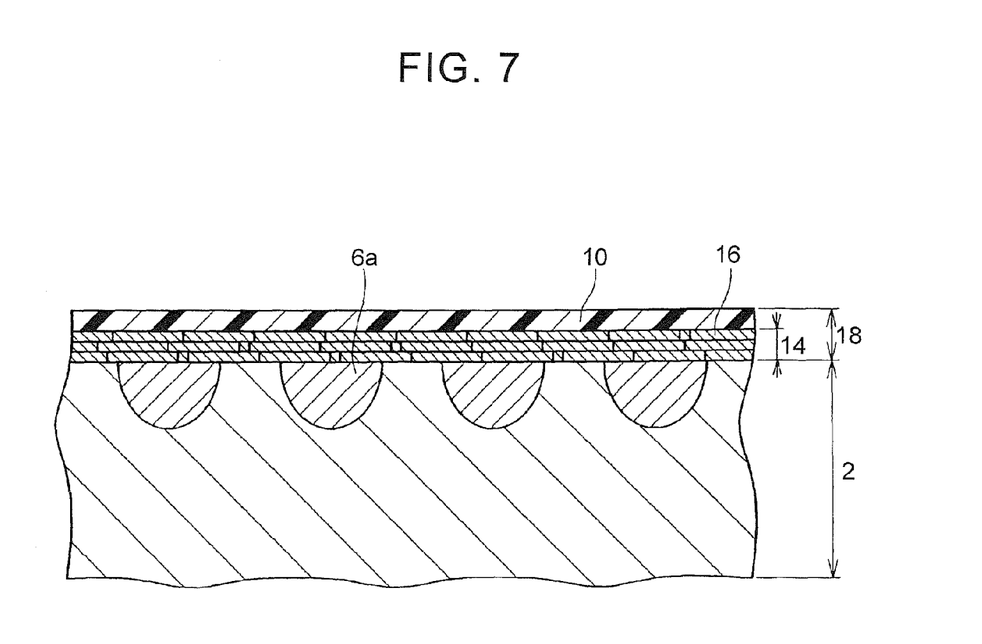
FIG. 7 is a sectional view showing a step for manufacturing the semiconductor device according to the first example of the present invention.

Next, in step S6, heat treatment of the SiC substrate 2 is carried out. First of all, a temperature of the SiC substrate 2 is increased to, for example, 100° C. Thus, a volume of the resin 10 that forms the protective coat 18 is decreased (FIG. 7). As a result, the carbon nanotubes 16 are closely packed inside the protective coat 18. Thus, a carbon layer 14 is formed inside the protective coat 18. The carbon layer 14 is formed at a position that is in contact with the surface of the SiC substrate 2.

Next, the temperature of the SiC substrate 2 is increased to, for example, 1800° C. As a result, the carbon nanotubes 16 that form the carbon layer 14 are bonded to each other by intermolecular force. As the temperature of the SiC substrate 2 is increased, the impurity introduced into the SiC substrate 2 is activated. Further, the impurity introduced is diffused within the SiC substrate 2. Thus, the impurity regions 6a are formed in the SiC substrate 2. The surface of the SiC substrate 2 is covered by the protective coat 18. Therefore, sublimation of Si (silicon) on the surface of the SiC substrate 2 is restrained.

Step S8 is a step for removing the protective coat 18. For example, oxygen plasma ashing is used for removal of the protective coat 18. By removing the protective coat 18, the above-mentioned state shown in FIG. 3 is achieved.

In the technology described in JP 2001-068428 A, a graphite layer is formed by carbonizing a photoresist layer formed on a surface of a SiC substrate. However, the photoresist contains components other than carbon, such as oxygen and sulfur. While oxygen, sulfur and so on are lost from the photoresist layer, carbon remains, thereby forming the graphite layer. Thus, density of carbon present inside the graphite layer is relatively low. As a result, the graphite layer may not have sufficient heat resistance. In the manufacturing method according to this example, the protective coat 18 made from the resin 10 and the carbon nanotubes 16 is formed on the surface of the SiC substrate 2. The carbon nanotubes 16 are formed of carbon. The carbon nanotubes 16 are bonded to each other, and form the carbon layer 14. As a result, it is possible to improve heat resistance of the protective coat 18 during the heat treatment of the SiC substrate 2.

JP 2001-068428 A describes a method in which DLC (diamond-like carbon) is used as a protective coat during heat treatment of a SiC substrate. However, an ECR-CVD system is required for forming DLC. Therefore, manufacturing cost for a semiconductor device is increased. In the manufacturing method according to this example, an ECR-CVD system is not required for forming the protective coat 18. Therefore, in the manufacturing method according to this example, an increase in manufacturing cost of the semiconductor device is restrained.

Japanese Patent Application Publication No. 2011-233780 (JP 2011-233780 A) describes a method for forming a graphene layer by carbonizing a surface of a SiC substrate. The graphene layer serves as a protective coat during heat treatment of the SiC substrate. In this method, a distance between carbon molecules arranged in a crystal lattice of the graphene layer formed by carbonization of the SiC substrate coincides with a distance between carbon molecules in a crystal lattice of the SiC substrate that is located in a layer directly beneath the graphene layer. Therefore, the graphene layer and the SiC substrate are bonded to each other relatively tightly. As a result, when general ashing is performed as cleaning of the SiC substrate, the protective coat 18 may not be fully removed.

On the contrary, in the manufacturing method according to this example, the mixed material layer 18, which is made from the resin 10 and the carbon nanotubes 16, is used as the protective coat during the heat treatment. When the SiC substrate 2 is heat-treated, the carbon layer 14, in which the plurality of carbon nanotubes 16 are bonded to each other, is formed on the surface of the SiC substrate 2. Bonding between the carbon layer 14 and the SiC substrate 2 is weaker than bonding between the graphene layer and the SiC substrate 2. Therefore, in the manufacturing method according to this example, it is possible to remove the protective coat 18 by general ashing.

In the manufacturing method according to this example, the resin 10 is used for forming of the protective coat 18. The resin 10 is easily immersed into uneven portions (for example, trenches) on the surface of the SiC substrate 2. Therefore, with the manufacturing method according to this example, occurrence of voids are restrained even in a case where the uneven portions are present on the surface of the SiC substrate 2.

Second Example

Next, a second manufacturing method for a semiconductor device using a SiC substrate 2 will be explained. First of all, similarly to the manufacturing method according to the first example, step S2 is carried out. In step S2, an impurity is introduced into the SiC substrate 2.

Figure 1:
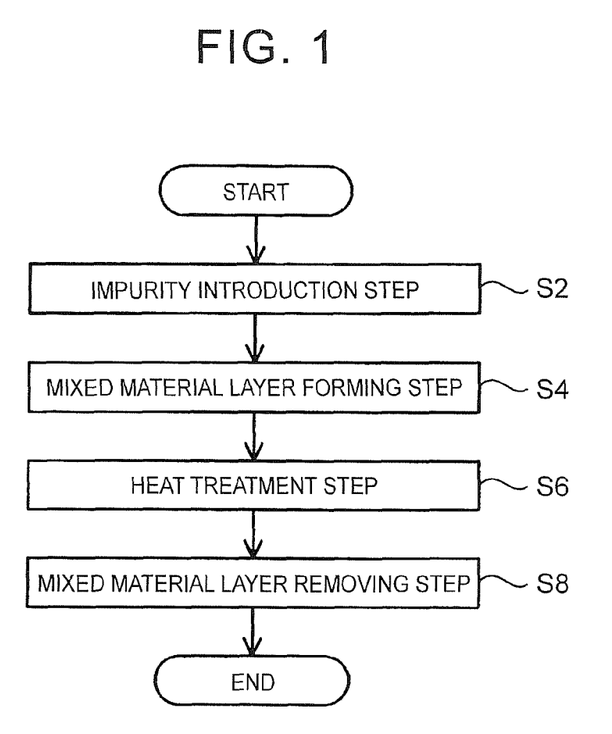
FIG. 1 is a flow diagram showing a manufacturing method for a semiconductor device according to a first example of the present invention.
Figure 8:
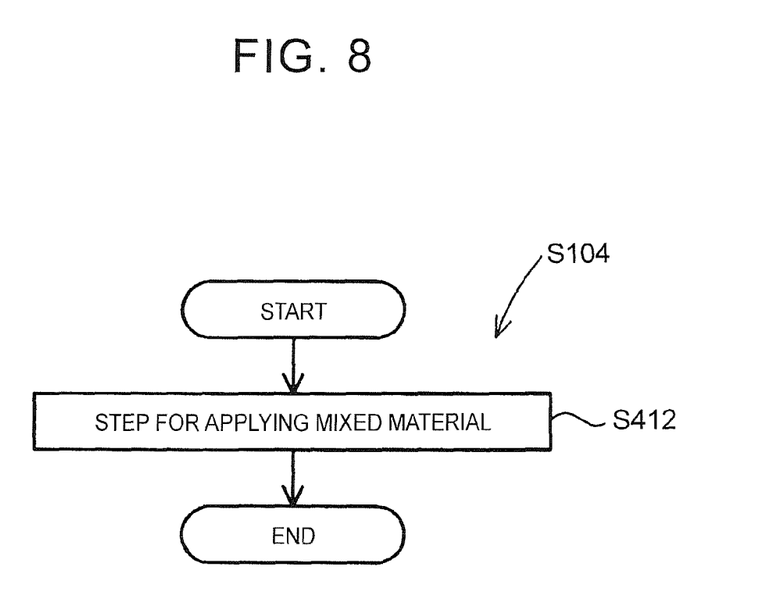
FIG. 8 is a flow diagram showing a manufacturing method for a semiconductor device according to a second example of the present invention.

In this example, after step S2 shown in FIG. 1, step S104 shown in FIG. 8 is carried out instead of step S4. Step S104 is a step for forming a mixed material layer 18. As shown in FIG. 8, the step S104 includes step S412. In step S412, a mixed material (10, 16) is applied on a surface of the SIC substrate 2 (a state that is the same as FIG. 6 is achieved). The mixed material (10, 16) is formed by mixing a resin 10 and carbon nanotubes 16. Thus, the mixed material layer 18 (a protective coat 18) is formed on the surface of the SiC substrate 2. A spin coat method, for example, may be used as a method for applying the mixed material (10, 16).

Next, in step S6 in FIG. 1, heat treatment of the SiC substrate 2 is carried out similarly to the first example. Due to the heat treatment, a carbon layer 14 is formed on the surface of the SiC substrate 2 (a state that is the same as FIG. 7 is achieved). Due to the heat treatment, the impurity is activated inside the SiC substrate 2. Further, the impurity is diffused inside the SiC substrate 2. Thus, impurity regions 6a are formed in the surface of the SiC substrate 2.

In the above-mentioned manufacturing method for the semiconductor device, the mixed material (10, 16), in which the resin 10 and the carbon nanotubes 16 are mixed, is applied on the SiC substrate 2. Thus, the protective coat 18, which is made of the resin 10 and the carbon nanotubes 16, is formed on the surface of the SiC substrate 2.

In the above-mentioned manufacturing method for the semiconductor device, the carbon nanotubes 16 are used as a material for forming the protective coat 18. However, other fibrous carbon material may be used as a material for forming the protective coat 18. For example, carbon fiber and carbon nanofiber may be used as the fibrous carbon material.

However, carbon nanotubes have higher aggregating effect than that of other fibrous carbon materials. This means that carbon nanotubes easily aggregate and are adsorbed to each other when the carbon nanotubes are introduced into the resin 10. Thus, when carbon nanotubes are used as a fibrous carbon material, the protective coat may be formed while reducing density of the fibrous carbon material to be introduced into the resin 10.

According to the foregoing manufacturing method for the semiconductor device, the semiconductor device is manufactured using the SiC substrate 2. However, the semiconductor device may be manufactured using a Si (silicon) substrate.

Although specific examples of the present invention have been explained so far in detail, the examples are illustrative only, and do not limit the scope of the claims. The techniques described in the scope of the claims include various modifications and changes of the specific examples illustrated above. In addition, each or various combinations of the technical elements explained in this specification and the drawings exert technical utility. The techniques exemplified in this specification and the drawings are able to achieve a plurality of objectives simultaneously, and have technical utility only by achieving one of the objectives.

What is claimed is:

1. A manufacturing method for a semiconductor device, comprising:

introducing an impurity into a SiC substrate;

forming a mixed material layer directly on a surface of the SiC substrate into which the impurity is introduced, the mixed material layer is formed before the impurity introduced into the SiC substrate is activated, the mixed material layer is made of a resin and a fibrous carbon material;

performing heat treatment of the SiC substrate in which the mixed material layer is formed on the surface of the SiC substrate; and removing the mixed material layer after the heat treatment.

2. The manufacturing method for the semiconductor device according to claim 1, wherein the forming the mixed material layer includes forming a resin layer on the surface of the SiC substrate, and introducing the fibrous carbon material into the formed resin layer.

3. The manufacturing method for the semiconductor device according to claim 1, wherein the forming the mixed material layer is performed by applying a mixed material, in which the resin and the fibrous carbon material are mixed, on the surface of the SiC substrate.

4. A manufacturing method for a semiconductor device, comprising:

introducing an impurity into a SiC substrate;

forming a mixed material layer on a surface of the SiC substrate into which the impurity is introduced, the mixed material layer is made of a resin and a fibrous carbon material;

performing heat treatment of the SiC substrate in which the mixed material layer is formed on the surface of the SiC substrate; and removing the entire mixed material layer after the heat treatment.

5. The manufacturing method for the semiconductor device according to claim 4, wherein the forming the mixed material layer includes forming a resin layer on the surface of the SiC substrate, and introducing the fibrous carbon material into the formed resin layer.

6. The manufacturing method for the semiconductor device according to claim 4, wherein the forming the mixed material layer is performed by applying a mixed material, in which the resin and the fibrous carbon material are mixed, on the surface of the SiC substrate.

* * * * *